(12) United States Patent
Zang et al.

(10) Patent No.: US 11,026,358 B2
(45) Date of Patent: *Jun. 1, 2021

(54) BIOPOLYMER-BASED ELECTROMAGNETIC INTERFERENCE SHIELDING MATERIALS

(71) Applicant: Software Defined Technologies Inc., Carlsbad, CA (US)

(72) Inventors: De Yu Zang, Irvine, CA (US); Michael M. Salour, Carlsbad, CA (US); James G. Grote, Yellow Spring, OH (US)

(73) Assignee: SOFTWARE DEFINED TECHNOLOGIES, INC, Carlsbad, CA (US)

(*) Notice: Subject to any disclaimer, the term of this patent is extended or adjusted under 35 U.S.C. 154(b) by 59 days.

This patent is subject to a terminal disclaimer.

(21) Appl. No.: 16/284,507

(22) Filed: Feb. 25, 2019

(65) Prior Publication Data

US 2019/0191600 A1 Jun. 20, 2019

Related U.S. Application Data

(60) Continuation of application No. 15/196,114, filed on Jun. 29, 2016, now Pat. No. 10,219,418, which is a (Continued)

(51) Int. Cl.
*H05K 9/00* (2006.01)
*H05K 1/02* (2006.01)
(Continued)

(52) U.S. Cl.
CPC ............. *H05K 9/0083* (2013.01); *C09D 5/32* (2013.01); *C09D 199/00* (2013.01);
(Continued)

(58) Field of Classification Search
CPC .. H05K 9/0075; H05K 9/0073; H05K 9/0071; H05K 9/0003; H05K 1/026;
(Continued)

(56) References Cited

U.S. PATENT DOCUMENTS 6,265,466 B1 * 7/2001 Glatkowski ............... G21F 1/10
523/137
10,219,418 B2 * 2/2019 Zang .................... C09D 199/00
(Continued)

OTHER PUBLICATIONS

Singh, T.B. et al. Bio-Organic Optoelectronic Devices Using DNA. Advances in Polymer Science, vol. 223 (2010): 73-112.
(Continued)

*Primary Examiner* — Tabassom Tadayyon Eslami
(74) *Attorney, Agent, or Firm* — Culhane Meadows PLLC; Orlando Lopez

(57) ABSTRACT

An electromagnetic interference (EMI) shielded device which includes an object to be shielded and an EMI shielding material encompassing the object. The EMI shielding material is made up of, but not limited to a broadband biopolymer or polymer dissolved in organic solvents, and metal and carbon-based nano-powders or nanoparticles. The specific makeup of the shielding material and fabrication procedure of the shielding material is also included herein.

32 Claims, 6 Drawing Sheets

Related U.S. Application Data division of application No. 13/746,993, filed on Jan. 22, 2013, now Pat. No. 9,408,336.

(60) Provisional application No. 61/588,981, filed on Jan. 20, 2012.

(51) Int. Cl.
*C09D 5/32* (2006.01)
*C09D 199/00* (2006.01)
*H05K 3/12* (2006.01)

(52) U.S. Cl.
CPC ......... *H05K 1/0216* (2013.01); *H05K 3/1283* (2013.01); *H05K 9/009* (2013.01); *H05K 1/0209* (2013.01); *H05K 9/0022* (2013.01); *H05K 2201/0257* (2013.01)

(58) Field of Classification Search
CPC .......... H05K 9/00; C09D 5/32; C09D 199/00; H01L 2225/06537
USPC ...................................................... 427/96.3
See application file for complete search history.

(56) References Cited

U.S. PATENT DOCUMENTS

2013/0004753 A1 1/2013 Majumdar et al.
2013/0065039 A1 3/2013 Tada et al.

OTHER PUBLICATIONS

Zang, D.Y. et al. DNA-Based Nanoparticle Composite Materials for EMI Shielding. Proc. SPIE 8259, RF and Millimeter-Wave Photonics II, 825908 (Feb. 23, 2012): 1-9.

* cited by examiner

BIOPOLYMER-BASED ELECTROMAGNETIC INTERFERENCE SHIELDING MATERIALS

CROSS REFERENCE TO RELATED APPLICATIONS

This application is a continuation of co-pending U.S. patent application Ser. No. 15/196,114, filed on Jun. 29, 2016, entitled BIOPOLYMER-BASED ELECTROMAGNETIC INTERFERENCE SHIELDING MATERIALS, which is a divisional of U.S. patent application Ser. No. 13/746,993, filed Jan. 22, 2013, entitled BIOPOLYMER-BASED ELECTROMAGNETIC INTERFERENCE SHIELDING MATERIALS, which in turn claims priority to and benefit of U.S. Provisional Application No. 61/588,981, filed Jan. 20, 2012, the entire contents of which are incorporated by reference herein for all purposes.

STATEMENT REGARDING FEDERALLY SPONSORED RESEARCH OR DEVELOPMENT

This invention was made with government support under Contract No. FA-8650-10-0-C-5406 awarded by the U.S. Air Force. The government has certain rights in the invention.

BACKGROUND OF THE INVENTION

As the speeds at which electronics operates continue to increase, the stray high frequency radio frequency (RF) or electromagnetic interference (EMI) radiation that is emitted continues to increase as well. This high frequency RF/EMI radiation interferes with all the electronic devices, chips and circuit boards in close proximity to each other and can cause the chips and circuits to malfunction. Thus, the electronic devices, chips and circuit boards need to be shielded from one another to prevent this stray radiation from causing malfunctions. This RF/EMI radiation can come from devices, chips, intra- and inter circuit boards and between boards. The higher the frequencies the more difficult and expensive it becomes to shield the circuits. The prior and current RF/EMI shielding technologies use traditional techniques based on conductive materials or coatings, such as gold (Au), copper (Cu), silver (Ag) or aluminium (Al), surrounding the device, chip and/or circuit board. This is a complicated, expensive and time-consuming process.

Prior procedures are difficult, complicated, labor intensive, expensive and time-consuming, especially the electrical grounding processing.

In addition, the insulating materials or molds, which are deposited on top of the device, chip or circuit to prevent electrical shorting, typically have low thermal conductivity. This holds the heat, generated by the device, chip or circuit, in the device, chip or circuit. Retention of heat in the device, chip or circuit can cause overheating, reduce performance and reduce lifetime.

Another typical example is a conductive metal grid or mesh enclosure surrounding the device, chip or circuit to block external static and non-static electric fields. This is known as a Faraday cage. A Faraday cage shields the interior from external electromagnetic radiation if the conductor is thick enough and the holes of the grid or mesh are significantly smaller than the wavelength of the radiation. This type of shielding is also rigid and non conformable. In addition, neither type of shielding technique shields between devices or wires within a chip or between chips or wires within or on a board. They only shield from internal radiation getting out or from external radiation getting in.

BRIEF SUMMARY OF THE INVENTION

The embodiments of this disclosure facilitate the fabrication and applications of biopolymer-based, broadband electromagnetic interference shielding materials (BESM) that can be employed to numerous areas including, but not limited to, electronics, telecommunications, and aviation, etc.

Broadband biopolymer-based electromagnetic interference shielding materials (BESM) are made up of, but not limited to, deoxyribonucleic acid (DNA), DNA lipid complex, silk, or any other biopolymer, which could be dissolved in organic or ionic solvents, and metal or carbon-based nano-powders or nanoparticles. The lipid material could be, but not limited to, cetyltrimethylammonium chloride or hexadecyltrimethylammonium chloride (CTMA). The organic solvents could be, but not limited, butanol, ethanol, methanol, or a chloroform/alcohol blend. The metal and carbon-based nano-powders or nanoparticles could include, but not limited to, noble metals (such as silver, gold, aluminum, copper), carbon-based graphite, carbon black, graphene, nanotubes, flakes, fibers or other conductive materials.

The BESM can be nonconductive, if the metal filler doping ratio is lower than the percolation threshold. The surface resistance of nonconductive BESM films could be >30 M$\Omega$/sq. and the BESM can form BESM films on certain substrates and is spreadable, conformable and curable at low or room temperature with good adhesion with most materials including, but not limited, metal, glass, wood, plastics, semiconductors and other biopolymers.

The biopolymer-based material is not restricted to DNA-based and could be any organic polymers including, but not limited, Poly(methyl methacrylate) (PMMA) or Polyvinyl alcohol (PVA), polycarbonate, etc.

The BESM films have very have high EMI shielding efficiency over frequency ranges from substantially DC (0 Hz) to 100 GHz. The shielding efficiency, for example, could be as high as 60 dB for a thin BESM film with a thickness of ~50 µm. For example, but not limited thereto, the BESM films provide efficiency of up to approximately 60 dB for shielding material with a thickness of approximately 50 mm over a frequency range in the DC and Hz and MHz ranges and approximately 20-30 dB in the GHz range.

Further, a thin BESM layer (typically ~30-50 µm) could block EMI radiation up to, for example, 60 dB effectively over an RF frequency range from low kilohertz (KHz) to tens of gigahertz (GHz), exhibiting excellent EMI shielding efficiency.

In addition, the method of making the EMI shielding material includes, but is not limited to the following steps: dissolving DNA in de-ionized water; dissolving CTMA in de-ionized water; making a DNA-CTMA complex; making a butanol based DNA-CTMA solution; and making the EMI shielding material in the form of, for example, a film from the butanol based DNA-CTMA solution.

BESM also has the following advantages:
a. High EMI shielding efficiency.
b. Nonconductivity, making a single EMI shielding layer on top of, and in direct contact with, electronic circuit boards possible.
c. Spreadable (with liquid phase BESM), conformable and compatible with the shapes and most object materials, such as metals, glass and plastic, etc.

d. Large thermal conductivity that could dissipate heat generated by high-speed electronics e. Low cost for materials and processes, etc.

For a better understanding of the present invention, reference is made to the accompanying drawings, detailed description and claims.

DETAILED DESCRIPTION OF THE INVENTION

Figure 1:
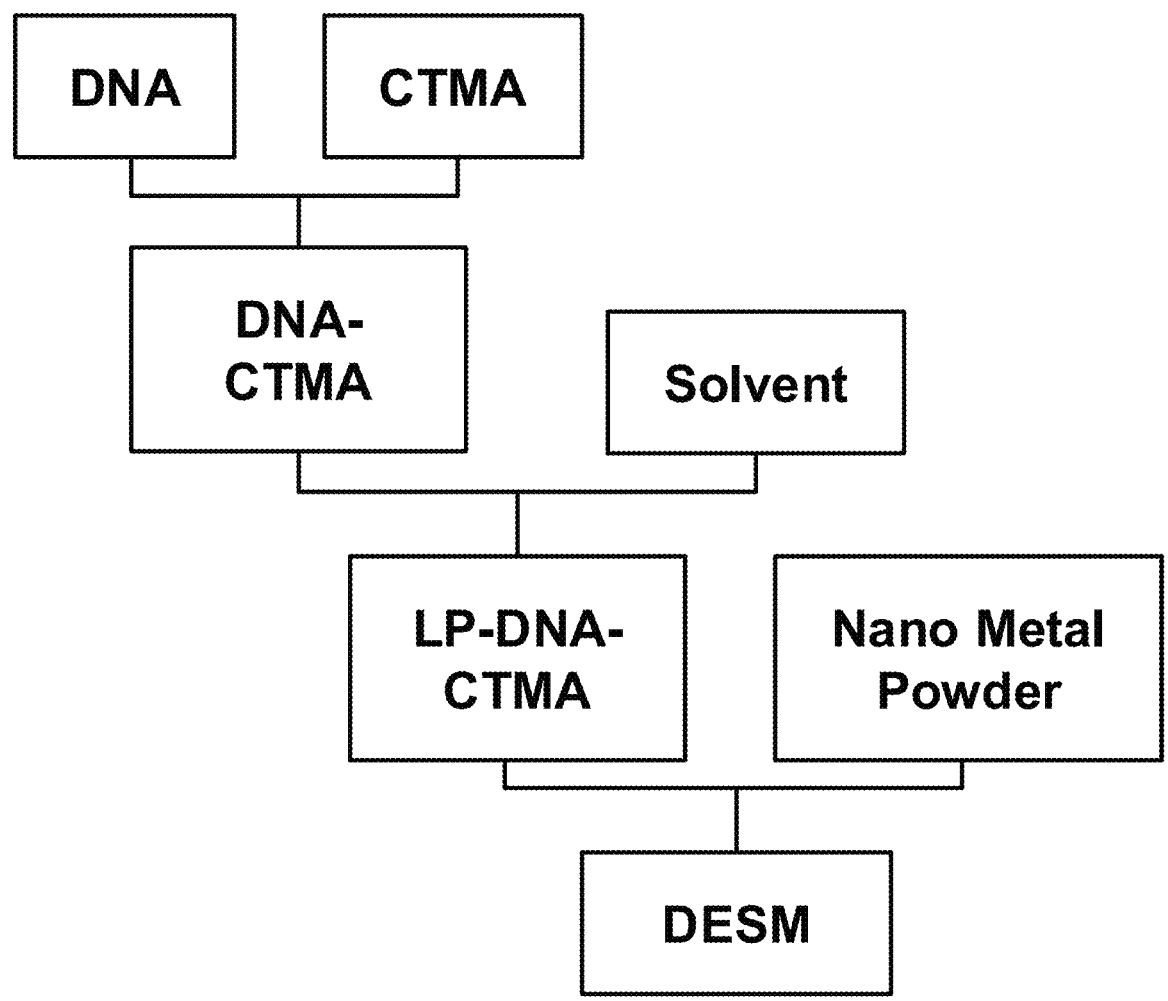
FIG. 1 is a schematic block diagram illustration of a basic fabrication procedures of the BESM (DNA-based in this example)

The embodiments of this disclosure facilitate the fabrication and applications of biopolymer-based, broadband electromagnetic interference shielding materials (BESM) that can be employed to numerous areas including, but not limited to, electronics, telecommunications, and aviation, etc.

Broadband (from DC (0 Hz) to approximately 100 GHz) biopolymer-based electromagnetic interference shielding materials (BESM) are made up of, but not limited to, deoxyribonucleic acid (DNA), DNA lipid complex, silk, or any other biopolymer, which could be dissolved in organic or ionic solvents, and metal or carbon-based nano-powders or nanoparticles. The lipid material could be, but not limited to, cetyltrimethylammonium chloride or hexadecyltrimethylammonium chloride (CTMA). The organic solvents could be, but not limited, butanol, ethanol, methanol, or a chloroform/alcohol blend. The metal and carbon-based nanopowders or nanoparticles could include, but not limited to, noble metals (such as silver, gold, aluminum, copper), carbon-based graphite, carbon black, graphene, nanotubes, flakes, fibers or other conductive materials.

The BESM can be nonconductive, if the metal filler doping ratio is lower than the percolation threshold. In a mixture between a dielectric and a metallic component, the conductivity and the dielectric constant of this mixture show a critical behavior if the fraction of the metallic component reaches the percolation threshold. The behavior of the conductivity near this percolation threshold will show a smooth changeover from the conductivity of the dielectric component to the conductivity of the metallic component. So, below percolation threshold the BSEM is non-conductive and above the percolation threshold the BSEM is conductive. The surface resistance of nonconductive BESM films could be >30 MΩ/sq. and the BESM can form BESM films on certain substrates and is spreadable, conformable and curable at low or room temperature with good adhesion with most materials including, but not limited, metal, glass, wood, plastics, semiconductors and other biopolymers.

The biopolymer-based material is not restricted to DNA-based and could be any organic polymers including, but not limited, Poly(methyl methacrylate) (PMMA) or Polyvinyl alcohol (PVA), polycarbonate, etc.

The BESM films have very have high EMI shielding efficiency over frequency ranges from substantially DC to 100 GHz. The shielding efficiency, for example, could be as high as 60 dB for a thin BESM film with a thickness of ~50 μm. For example, but not limited thereto, the BESM films provide efficiency of up to approximately 60 dB for shielding material with a thickness of a approximately 50 mm over a frequency range in the DC and Hz and MHz ranges and approximately 20-30 dB in the GHz range.

Further, a thin BESM layer (typically ~30-50 μm) could block EMI radiation up to, for example, 60 dB effectively over an RF frequency range from low kilohertz (KHz) to tens of gigahertz (GHz), exhibiting excellent EMI shielding efficiency.

BESM also has the following advantages:

a. High EMI shielding efficiency.

b. Nonconductivity, making a single EMI shielding layer on top of, and in direct contact with, electronic circuit boards possible.

c. Spreadable (with liquid phase BESM), conformable and compatible with the shapes and most object materials, such as metals, glass and plastic, etc.

d. Large thermal conductivity that could dissipate heat generated by high-speed electronics.

e. Low cost for materials and processes, etc.

The present embodiments utilize non-conductive, biopolymer-based, metal or carbon nanoparticle or nanopowder composite, EMI shielding material (BESM), and may involve the following process: cast the BESM on the boards to form a single layer coating. The coating could be cured at low or room temperature, for example, approximately 60-80 degrees F. for a few hours, for example, approximately 1-4 hours. There is no need for grounding, since the coating is nonconductive Another important advantage of using non-conductive BESM for EMI-shielding on high-speed electronic devices and PCBs is that the BESM coating could quickly dissipate the heat generated by the high-speed electronics, due to its larger thermal conductivity compared to other polymers and epoxies. For example, thermal conductivity was measured of 0.82 watts/meter, degrees Kelvin (W/(m, K)) for DNA only (no nanoparticles of nanopowders) and 0.62 W/(m, K) for DNA-CTMA only (no nanoparticles of nanopowders). The thermal conductivity of PMMA is 0.12 W/(m, K). Therefore, the thermal conductivity of the DNA-based materials is a minimum of five to seven times higher than that of other polymers and epoxies.

It is also possible with the present embodiments to harden electrical, electronic devices, systems, transformers and transmission lines.

Further, for sensors applications, the BESM can fit in the sensors applications under an environment where radio frequency (RF) is present. An excellent example of such applications is the hyperthermia using microwave treatment for cancer. It was found that cancer cells are very sensitive to temperature. By heating the cancer cells, it may kill the tumors. It has been shown that the cancerous tissues can be destroyed at exposures of ~108° F. for one hour. Hyperthermia treatment of cancer is based on this. In the hyperthermia microwave treatment, the temperature around the cancer areas can be raised using RF radiation, similar to that of microwave ovens used in our kitchens to heat food. Precisely controlling temperature is the key. To monitor the temperature precisely, expensive dielectric and optical fiber-based temperature sensors are most commonly used since inexpensive, metal-based temperature sensors will disturb the RF waveforms and also, loose measurement accuracy. Coating BESM on to the metal-based temperature sensors can avoid such problems and reduce the cost of the treatment.

The broadband, biopolymer-based EMI shielding materials (BESM) can be produced by mixing, for example, DNA-lipid complex (DNA-CTMA) and metal-based nanoparticles or nanopowders as fillers, where CTMA is an abbreviation of cetyltrimethylammonium chloride or hexadecyltrimentylamonium chloride.

The process procedures are described with respect to FIG. 1. The detailed process for a DNA-lipid-based BESM material is described as follows;

Make Water-Based DNA Solution

Dissolve DNA in de-ionized water at room temperature, for example, approximately 60-80 degrees F. at a ratio of approximately 4 grams/liter using a magnetic stirrer. Mix until fully dissolved which may take approximately two hours;

Dissolve CTMA in deionized water at approximately room temperature, for example, approximately 60-80 degrees F. at a ratio of approximately 4 grams/liter using a magnetic stirrer. Mix until fully dissolved which may be approximately five minutes;

Make DNA-lipid complex, DNA-CTMA. The DNA solution is added drop-wise to the CTMA solution with a burette at a rate of about 1 drop per minute. A white DNA-CTMA precipitate forms as the DNA is added to the CTMA. The solution is mixed for an additional 4 hours at room temperature. Filter DNA-CTMA precipitates out of the mixture and rinse thoroughly;

Place the DNA-CTMA precipitates in a beaker and then place in an oven at ~40° C. to dry the DNA-CTMA precipitates overnight, for example, approximately 8 hours;

Make butanol-based DNA-CTMA solution: Dissolve the DNA-CTMA precipitate in butanol at a ratio of about 10 weight percent of DNA-CTMA to butanol using a tumbler or a magnetic stirrer. At room temperature, for example, approximately 60-80 degrees F. mix until completely dissolved which is for approximately 6-8 hours. At 40 degrees C. the mixing time can be reduced to approximately 1 hour.

Making BESM Films

Make BESM by mixing metal nano-powders at a desired ratio (wt %, typically from 2-10 wt %) with the DNA-CTMA-butanol solution using a stirrer or sonicator;

Cast BESM on substrates, such as glass or plastic slides and dry them at room temperature to form BESM films on the substrates. BESM film thickness is typically around 30-50 µm.

Figure 2A:
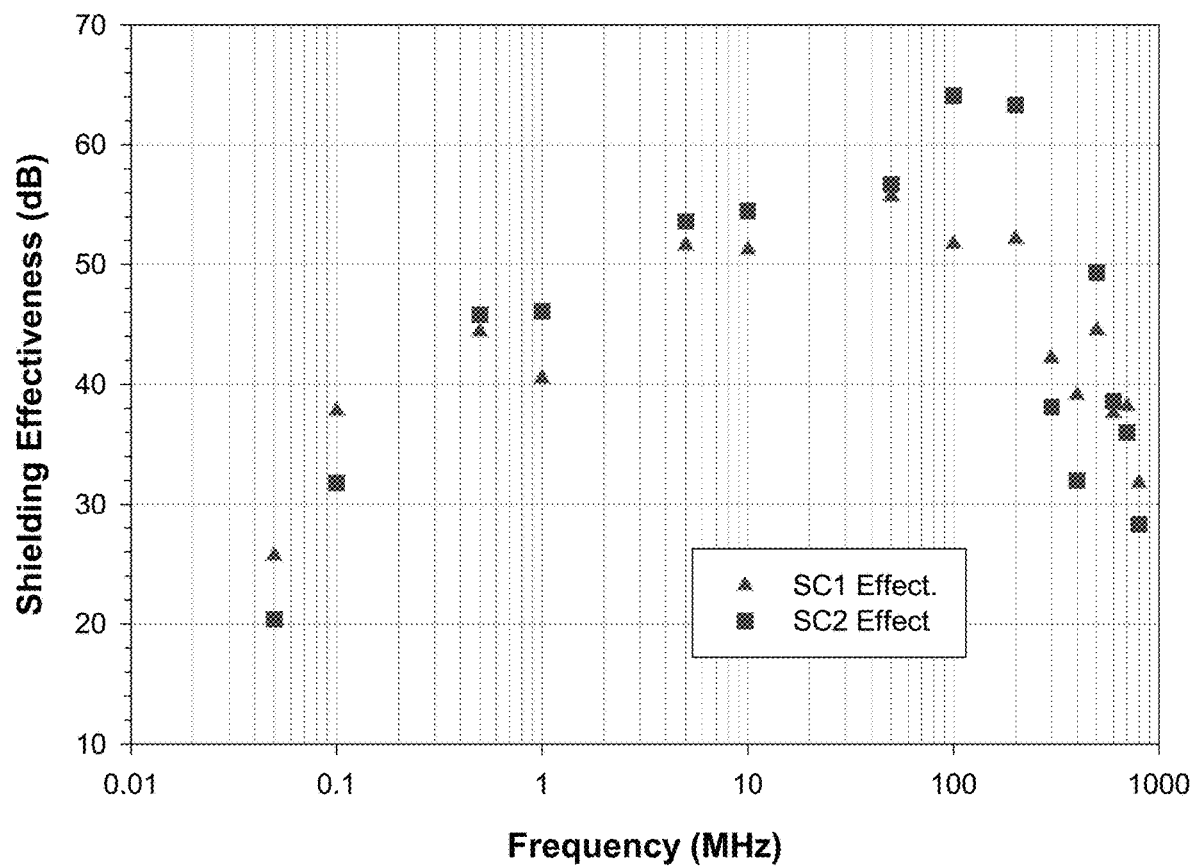
FIG. 2A is a set of typical measurement results of EMI shielding effectiveness of BESM at a frequency range from tens of KHz to hundreds of MHz.
Figure 2B:
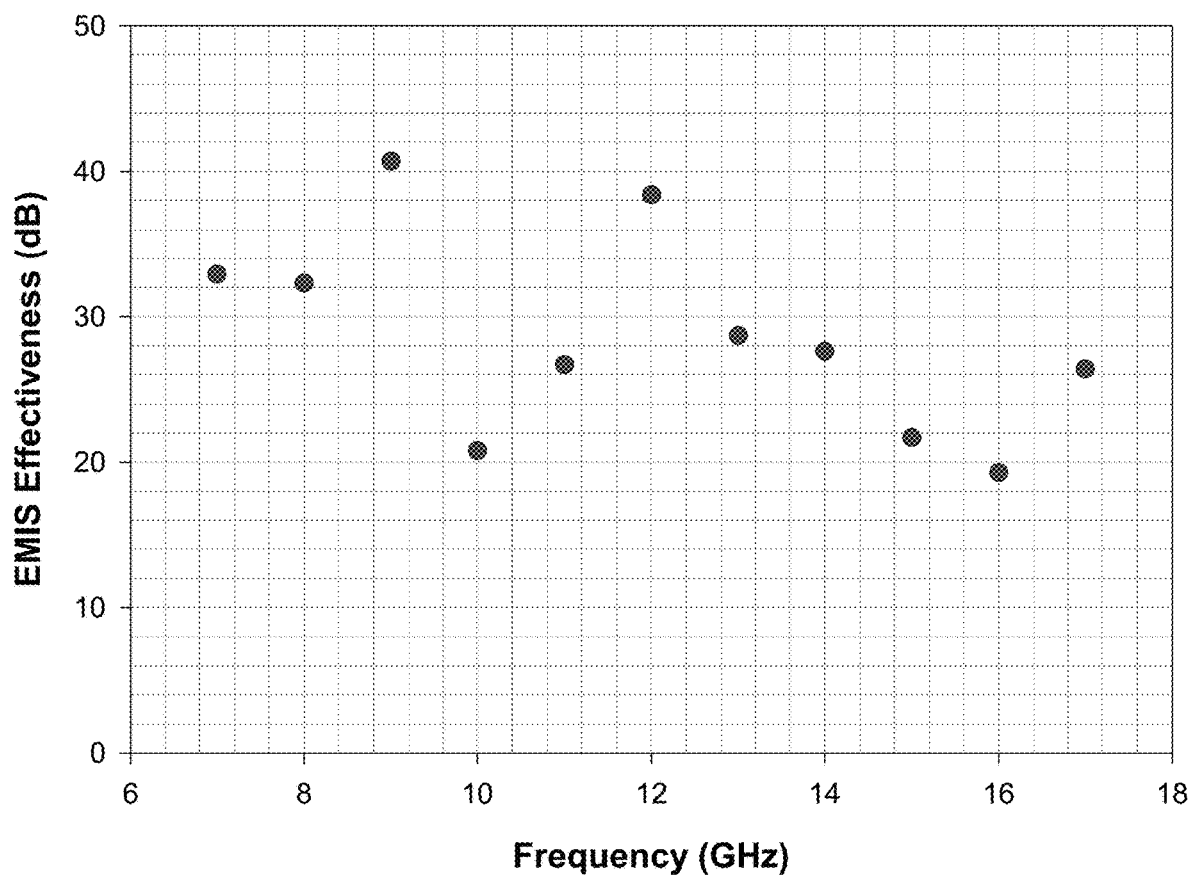
FIG. 2B is a set of typical measurement results of EMI shielding effectiveness of BESM at a frequency range from 6 GHz to 16 GHz.

A wide selection of metal nanoparticle and nanopowder fillers have been tested for their performance in EMI shielding efficiency, including, but not limited, silver, carbon-based graphite, graphene and other metal-based nanopowders and nanoparticles;

BESM has been tested under a wide frequency range. FIGS. 2A and 2B show the BESM test results for a frequency range of from tens of KHz to hundreds of MHz. SC1 and SC2 were DNA-CTMA-silver nanopowder-based BESM samples on scotch tape with silver-doping ratios of 4% and 8% and thicknesses of 30-50 µm, respectively.

Figure 3:
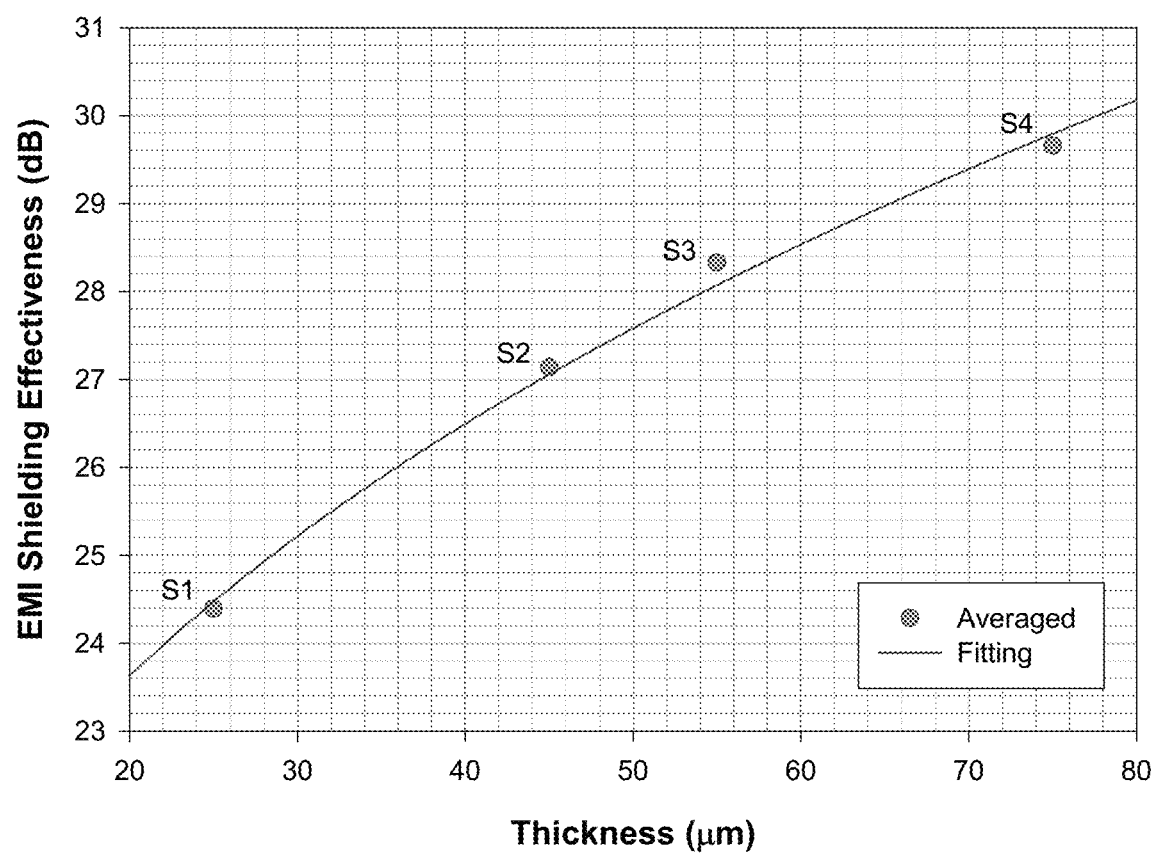
FIG. 3 is a set of typical measurement results of the EMI shielding effectiveness vs. film thickness in BESM samples.

BESM has been tested under wide frequency range. FIG. 3 shows the BESM EMI shielding effectiveness for a frequency range of from 7 GHz to 17 GHz. The samples were DNA-CTMA-silver and silver-aluminum nanopowder-based BESM samples on 1 inch×3 inch glass slides with Ag and Ag—Al-doping ratios of 5% each and thickness of 30-50 µm.

BESM has been tested over a temperatures range of −50° C. to +70° C. and over a frequency range of from 7 GHz to 16 GHz for EMI shielding efficiency. The averaged results showed no significant changes.

Figure 4:
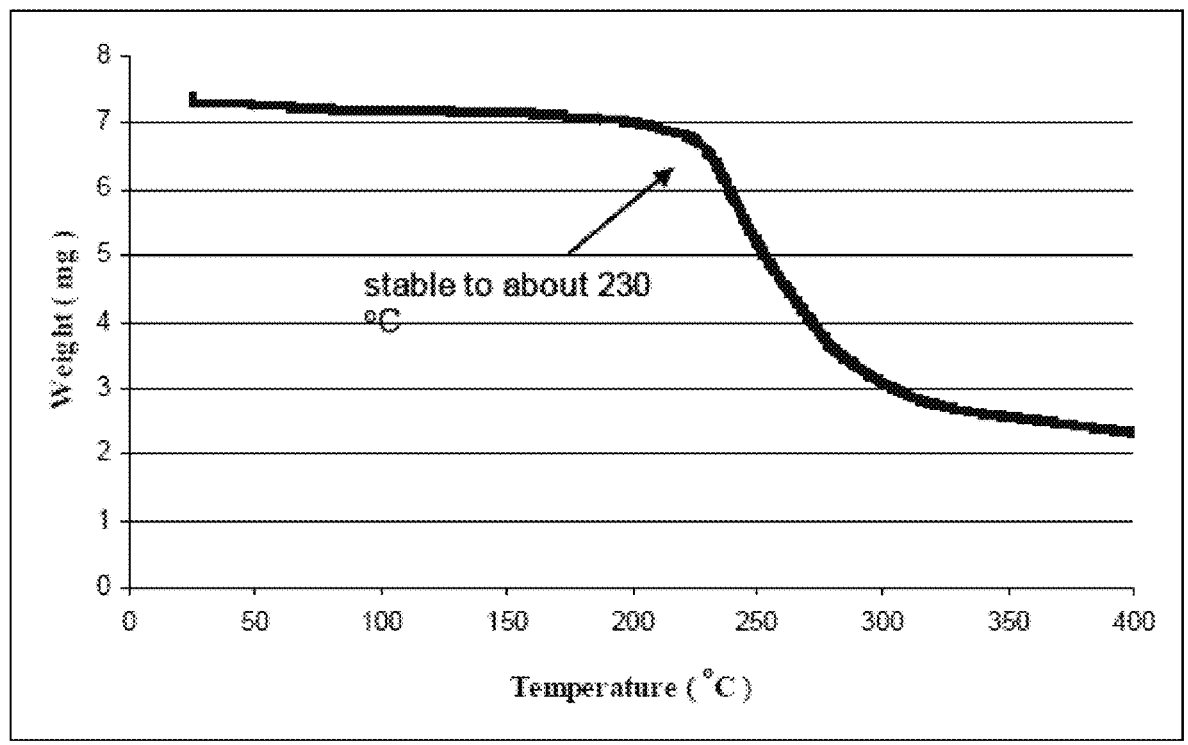
FIG. 4 is a DNA-CTMA-based film's thermal properties, indicating the film could sustain and be stable above 230° C.

DNA-CTMA possesses very stable thermal properties. FIG. 4 shows the film can sustain and be stable at temperatures as high as 230° C.

Non-biopolymer-based BESM materials, such as, but not limited, Poly(methyl methacrylate) (PMMA) and silver nanopowder were also formulated and could be used as a polymer matrix to replace lipid-DNA-CTMA.

In summary, novel biopolymer-metal and carbon nanoparticle/nanopowder-based EMI shielding materials (BESMs) have proven very effective nonconductive materials for broadband and high EMI shielding efficiency. The DNA-lipid-based complex (DNA-CTMA) served as the polymer matrix host, while the metal and carbon-based nanoparticles and nanopowders served as the fillers or guests. BESM could be made highly conductive or nonconductive (>30 MW/sq), depending on the nanoparticle and nanopowder doping ratios, whether one reaches the percolation threshold or not. It was found that at certain doping ratios, between about 4% and about 8%, which are also lower than the percolation threshold, the BESM films still possess very high EMI shielding efficiency while at the same time being nonconductive. Doping ratios for nanopowders are 4% to 8% to ensure material is nonconductive.

Figure 5:
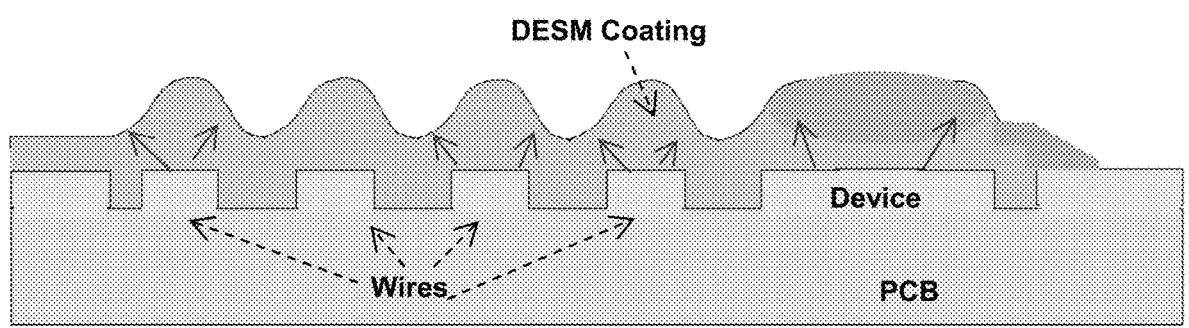
FIG. 5 is a schematic of a single layer EMI shielding coating on a microelectronic printing circuit board (PCB).

Embodiments of this invention including, but not limited to, the embodiments described above may be utilized as a single layer EMI shielding coating on microelectronics circuitry for intra- and inter-EMI shielding, as shown, for example, in FIG. 5.

Composite materials, such as polymer-matrices containing conductive fillers, are very attractive for shielding electromagnetic interference (EMI) due to their high shielding efficiency and seamlessness, processability, flexibility, lightweight and low-cost. Here, we report the development of novel, biopolymer-based EMI-shielding materials (BESMs), made up of DNA and metal and carbon nanoparticles and nanopowders. A thin DNA-based BESM layer (typically ~30-50 µm) can effectively block EMI radiation up to 60 dB over an RF frequency range of from KHz to tens of GHz, exhibiting excellent EMI shielding efficiency. A wide selection of metal and carbon nanoparticle/nanopowder fillers for BESMs has been tested for their performance in EMI shielding efficiency. Among them, silver and carbon-based nanoparticles/nanopowders have demonstrated the best performance and were selected for further investigation. The silver-doped DNA-based BESM films could also be made non-conductive while their EMI shielding efficiency was still well-preserved. The nonconductive BESM could have a great potential in the microelectronics industries for EMI shielding on electronic devices and circuit boards.

The present embodiments incorporate DNA-based biopolymer EMI-shielding materials (BESMs), made up of DNA and metal nanoparticles and nanopowders. Doped with adequate metal and carbon-based nanoparticles and nanopowders as fillers, the BESMs have exhibited excellent EMI shielding efficiency. It has been shown that a thin BESM layer (typically ~50-100 µm) can block RF radiation up to 60 dB at frequencies ranging from KHz to tens of GHz. A wide selection of metal and carbon-based nanoparticles and nanopowders have been tested for their performance in EMI shielding efficiency. For example, but not limited thereto, silver and carbon have demonstrated excellent performance. Depending on the doping ratios, whether above or below the percolation threshold, the BESMs could be rendered very conductive or nonconductive. Even the nonconductive silver-doped DNA-based BESM films have shown very high EMI shielding efficiency. The nonconductive BESMs may have a great potential in the microelectronics industries for EMI shielding on electronic devices and circuit boards.

EMI shielding refers to absorbing or re-directing (reflecting or scattering) the propagation of electromagnetic radiation by a material as a shield.

a) Shielding by Reflection

For reflection of the radiation by a shield material, the material must be electrically conductive, i.e. it must have mobile charge carriers, (electrons or holes) which interact with the electromagnetic fields in the radiation. Metals are the most common materials for reflection-type shielding. The electrical conductivity of a shielding material needs not necessarily high and a material with a volume resistivity in the order of 1 $\Omega$-cm could be good enough for effective EMI shielding.

b) Shielding by Absorption

For significant absorption of the radiation by the shield, the shield should have electric and/or magnetic dipoles that interact with the electromagnetic fields in the radiation fields. The materials that have a high value for their dielectric constant could provide efficient electric dipoles. It should be noted that the reflection losses decrease with increasing frequency, whereas the absorption losses increase with increasing frequency. Hence, EMI-shielding based on absorption would be much more effective at higher RF frequencies.

c) Shielding by Multiple Reflections (Scattering)

The mechanism of EMI shielding by multiple reflections, or scattering, is quite different than the single reflection shielding using conductive materials. Multiple reflections usually refers to the reflections at various surfaces or interfaces throughout the shielding materials. This mechanism requires the presence of a large effective internal surface area or interface area in the shield. An example of a shield with a large internal surface area is a porous or foam material. Another example (we will use it in our approach) is a material containing fillers which provide large internal surface areas. The losses due to multiple reflections can be neglected when the distance between the reflecting surfaces or interfaces are much longer compared to the skin depth.

d) Skin Effect

Electromagnetic radiation at high frequencies penetrates only the near surface region of an electrical conductor. This is known as the skin effect. The electric field of a plane wave penetrating a conductor drops exponentially with increasing depth into the conductor. The depth at which the field drops to 1/e of the incident value is called the skin depth ($\delta$), which is given by $$\delta = \frac{1}{\sqrt{\pi f \mu \sigma}},$$

where f is frequency, $\mu$ is the magnetic permeability, which equals $\mu_0 \mu_r$ ($\mu_0 = 1.26 \times 10^{-6}$ H/m and $\mu_r$ is the relative magnetic permeability of the material compared with that of copper, which is 1), and $\sigma$ is the electrical conductivity in $\Omega^{-1} m^{-1}$. Therefore, the skin depth decreases with increasing frequency and with increasing conductivity or permeability.

e) Composite Materials for Shielding

Due to the skin effect, a composite material having conductive fillers with small unit size is very effective since the filler's surface areas are large. Therefore, the smaller unit size of the fillers in the composite material, the better the effectiveness of the EMI shielding.

The advantages of DNA-based shielding materials include:

a) Low Cost i. Low material cost. DNA is a byproduct of the fishing industry, such as salmon milt and row sacs; therefore it could be very low cost.

ii. Low processing cost due the simple and low temperature processing procedures.

b) Properties for High EMI-Shielding Effectiveness i. Variety of electrical conductivity. Depending the properties and concentrations of doping fillers, the DNA-based composite materials could be very conductive or nonconductive. More interestingly, the nonconductive BESM could have very efficient EMI shielding. Such a unique property of BESMs could have many applications in the microelectronics industry.

ii. Large dielectric constant of DNA. The dielectric constant of DNA has been measured at 8 to 14 and could be made >400. A large dielectric constant in the materials provides large amount of electric dipoles that effectively absorb EM wave, enhancing effectively EMI-shielding.

c) Large Thermal Conductivity

Measuring the thermal conductivity of, for example, DNA of 0.82 W/(m, K) shows it to be approximately seven time higher than PMMA IS THIS DEFINED?. A large thermal conductivity can dissipate heat quickly that is very important for EMI shielding on high-speed electronic devices, which usually create quite an amount of heat when they are operated.

The BESM described herein is comprised of a DNA-cetyltrimethylammonium (CTMA) matrix material and metal and carbon nanoparticles/nanopowders (fillers). The materials and fabrication procedures are described as follows.

DNA and DNA-CTMA: The raw DNA material (salmon sperm-based) was provided by Prof. N. Ogata, Chitose Institute of Science and Technology, Chitose, Japan. A DNA-lipid complex, namely DNA-CTMA was produced as the host matrix material in the experiments. DNA could be readily converted to the DNA-CTMA complex by a cationic surfactant reaction. The resulting DNA-CTMA complex is only soluble in polar organic solvents, but not soluble in water. The CTMA was purchased from Sigma-Aldrich.

Metal and Carbon fillers: A wide selection of metal and carbon nanoparticle/nanopowder fillers has been tested for their performance in EMI shielding efficiency.

Among them, silver and carbon-based nanoparticles and nanopowders have the best performance and were selected for further investigation. Some typical metal fillers used in our experience are listed in Table 1 below:

TABLE 1

Metal fillers used in BESM

| Metal Powder | Type | Size | Purity | Maker |
| --- | --- | --- | --- | --- |
| Ag | Metal-Basis | 0.7-1.3 µm | 99.9% | Alfa Aesar |
| Brass | Alloy | ~44 µm | 99.9% | Alfa Aesar |
| Cu | Metal-Basis | 0.5-1.5 µm | 99.0% | Alfa Aesar |
| Ag coated Al | Metal-Basis | ~50 µm | 99.0% | Alfa Aesar |

TABLE 1-continued

Metal fillers used in BESM

| Metal Powder | Type | Size | Purity | Maker |
|---|---|---|---|---|
| Fe | Metal-Basis | ~44 μm | 98.0% | Alfa Aesar |
| Graphite #1 | Synthetic Conductive | ~44 μm | 99.9995% | Alfa Aesar |
| Graphite #2 | Natural Crystal | 2-15 μm | 99.9995% | Alfa Aesar |
| Ni | Metal-Basis | ~50 μm | 99.995% | Alfa Aesar |
| Graphene | Flakes | 8 nm | 99.9% | Graphene Lab |

Making DNA-CTMA solutions is described in greater detail above and summarized below i. Make water-based DNA solution: Dissolve DNA in de-ionized water at a proper ratio using a magnetic stirrer at room temperature for several hours until DNA is completely dissolved;

ii. Dissolve CTMA in deionized water using a magnetic stirrer for a few minutes until CTMA is completely dissolved;

iii. Make DNA-lipid complex, DNA-CTMA. Mix DNA and CTMA solutions with stirring for several hours. The white DNA-CTMA precipitates will visibly appear and will accumulate in the mixture;

iv. Filter the DNA-CTMA precipitates out of the mixture and rinse it completely;

v. Place the DNA-CTMA precipitates in a beaker and then place it in an oven at ~40° C. to dry the DNA-CTMA precipitates overnight;

vi. Make butanol-based DNA-CTMA solution: dissolve DNA-CTMA precipitate in butanol using a tumbler or a stirrer for several hours until it fully dissolved.

Making BESM films is described in greater detail above and summarized below:

i. Make BESM by mixing metal and carbon nanoparticles and nanopowders at the desired ratio (wt %) with the DNA-CTMA solution using a stirrer or sonicator;

ii. Cast BESM on substrates, such as glass or plastic slides and dry them at room temperature to form BESM films on the substrates. BESM film thickness is typically around 30-50 μm.

Experiments and Results

The DNA-based BESM samples were tested for their EMI shielding effectiveness under a very wide frequency range from KHz to tens of GHz. To cover such wide testing frequency range, the testing was divided into two frequency ranges, one of which was from sub-HF to UHF bands (tens of KHz to ~1 GHz) and the other was for X and Ku bands (6-18 GHz). Two different test setups were employed for these two frequency ranges, respectively. More detail with respect to the testing is set forth in the paper De Yu Zang, James Grote, "DNA-based nanoparticle composite materials for EMI shielding", in RF and Millimeter-Wave Photonics II, Robert L. Nelson; Dennis W. Prather; Chris Schuetz; Garrett J. Schneider, Editors, Proceedings of SPIE Vol. 8259 (SPIE, Bellingham, W A 2012), 825908 which is incorporated herein in its entirety.

Test Setups

Test setup for High Frequency (X and Ku Bands)

The setup was based on direct and open-air measurements that consisted of an RF-isolating chamber, two horn-antennas, RF generator and spectral analyzer. The RF-isolating chamber (~19"×26"×40" inner space) was constructed with RF absorber boards, which were thick (~2 inches) multiple-layered, conductive plastic sponges covered with aluminum foils. The boards could block or absorb up to 30 dB RF radiation. Thus, the RF-isolating chamber could significantly reduce the RF disturbance outside and inside the chamber during the measurements. A pair of WR 90 horn-antennas (Advanced Technological Materials Co.) were used as the RF emitter and receiver, respectively. The RF generator and spectral analyzer were: HP 8341B RF generator (frequency range: 10 MHz-20 GHz) and HP 71200C RF spectral analyzer.

Two antennas were separated by ~15 cm, which was ~five times that of the RF wavelength (~3 cm at 10 GHz). Thus, the RF wave between the two antennas can be considered as a far field propagation. The BESM sample was located in the middle between the emitter and receiver.

Test Setup for Low Frequency (From Sub-HF to UHF Bands)

The test setup for low frequency testing was an indirect measurement using an electro-optic (EO)-based, electric (E)-field sensor. The setup consisted of an E-field sensor, an E-field generator, RF-generator and spectrum analyzer. In the experiments, the external E-field was controlled under MV/cm to keep the system in a linear regime, within which the system linearly responded to the RF power applied.

a) The EO E-Field Sensor

The EO E-field sensor is referred to as a slab coupled optical-fiber sensor (SCOS), constructed with an EO crystal and two specially-treated optical fibers. The fibers were pigtailed with the tiny piece of EO crystal, Potassium Titanyl Phosphate (KTP), which is an E-field sensing area, as shown in FIG. 2 (A). In the operation, the light beam was coupled into one optical fiber, passed through the EO crystal and then coupled out of another fiber. The light intensity would be altered by the presence of an external electric field in the EO crystal area via Pockels effect.

b) E-Field Generator and Test Scheme

A small and simple E-field generator formed by two parallel metal plates (~2.5"×2.5") was used in the experiments. In the operation, RF signals were applied to the E-field generator to create a strong E-field in the gap between the two parallel plates, where the EO E-field sensor was placed. As the RF was applied, the E-field generator create an E-field on the EO sensor and the light intensity in the EO sensor was altered by the E-field.

A pulse/function generator, HP 8111A, was employed to apply AC voltage to the E-field generator. The modulated light signals from the E-field sensor were detected by a photodetector (PD) and converted back to electrical signals, which were analyzed by an RF spectrum analyzer (HP 8656B). The system had linear response to the RF power if the e-field applied on the sensor was small enough ($E<10^6$ V/m). Therefore, the e-field was controlled to be not greater than $2\times10^4$ V/m for the experiments. Using this test setup, the EMI shielding effectiveness of BESM films could then be measured by comparing the strengths of the modulated light signals from the sensor with/without the BESM films in place.

BESM Samples

Most of the DNA-based BESM samples were made on glass slides (1"×3", typically) with a BESM film thickness of ~30-50 μm, except for a few which were made on Scotch tape. BESM glass samples were used for measurements in the high frequency ranges, while the BESM-Scotch tape samples were used in low-frequency ranges. The flexible BESM-Scotch tape samples could be easily wrapped on the E-field sensor As an example, but not limited thereto, twelve typical BESM samples on glass slides are listed in Table 2. They could be divided into two groups: a) single metal powders (S1-S4, S11 and S12) and b) multiple-metal powders (S5-S10). These samples were prepared for the measurements at high-frequencies (6-18 GHz).

Two BESM samples on Scotch tape were made with 4% and 8% Ag-doping ratios. Both samples were nonconductive and were prepared for the measurements at low-frequencies ranging from tens KHz to ~1 GHz.

mentioned above. Two silver-doped BESM samples on Scotch tape (SC1: Ag 4% and SC2: Ag 8%) were made for the measurements. Although the measurements were mostly limited by the system's signal-to-noise-ratio (SNR) in the frequency range below 200 MHz, their shielding effectiveness was still quite impressively high and it could reach up to >60 dB at ~100 MHz. At frequencies above 200 MHz, the shielding effectiveness was somehow affected by the RF

TABLE 2

Typical BESM Samples

| Samples | Dopers | DNA Concentration in butanol (wt %) | Doper Concentration in DNA-CTMA (wt %) | Surface Conductivity |
|---|---|---|---|---|
| S1 | Graphite #1[1] | ~10 | 10% | No |
| S2 | Graphite #2[2] | ~10 | 10% | Yes (at large areas) |
| S3 | Fe | ~10 | 20% | No |
| S4 | Ni | ~10 | 20% | No |
| S5 | Ag + Brass | ~10 | Ag: 5.3%, Brass: 7.8% | No |
| S6 | Ag + Cu | ~10 | Ag: 5%, Cu: 5% | No |
| S7 | Ag + Ag—Al[3] | ~10 | Ag: 5%, Ag—Al: 5% | Yes (at some small areas) |
| S8 | Ag + Fe | ~10 | Ag: 5.3%, Fe: 6.5% | No |
| S9 | Ag + Graphite #1[1] | ~10 | Ag: 5%, Graphite: 5.7% | No |
| S10 | Ag + Mumetal[4] | ~10 | Ag: 5%, Mumetal: 5% | Yes (at some small areas) |
| S11 | Mumetal[4] | ~10 | Mumetal: 10% | No |
| S12 | Ni | ~10 | Ni: 10% | No |

Test Results
Results from High Frequency Measurements

For example, but not limited thereto, twelve BESM samples listed in Table 2 above were tested for EMI shielding at frequencies of 6-18 GHz. These samples could be basically divided into two groups based on the types of the metal dopants: Group 1 (G1) with one single metal dopant; and Group 2 (G2) with multiple-metal dopants (silver plus other metals). In G1 group, single metal dopants included C #1 (synthetic conductive graphite), C #2 (natural microcrystal graphite), Ni, Fe, and Mumetal powders. In the G2 group, the dopants were: Ag-C #1, Ag-Brass, Ag—Fe, Ag—(Ag—Al), Ag—Ni and Ag-Mumetal. The shielding effectiveness of the G2 samples were generally better than that of most of the samples in the G1 group (except S1 and S2, which were compatible with that in G2 samples).

The test results are summarized in Figure X, in which the EMI shielding effectiveness of BESM films was plotted as a function of RF frequencies. The data in this figure are divided into two groups. The data points in one group were obtained from the measurements of samples in G2 and S1 and S2 in G1, while data in the other group were obtained from the measurements of four samples in G1 (S3, S4, S11 and S12). The dopants of these eight samples in the red circle were silver-based multiple-metal and carbon-based graphite powders, C #1 and C #2, respectively. These samples demonstrated impressive EMI shielding effectiveness over a frequency range from 6 to 18 GHz. In contrast, the data points in the blue circle, obtained from measurements of S3, S4, S11 and S12 in G1 with dopants of Iron, Ni, and Mumetal, showed relatively poor EMI shielding effectiveness.

Results from Low Frequency Measurements

For low frequency measurements, an indirect measurement technique was used based on EO E-field sensor, as leakage from the system; however, the shielding effectiveness was still mostly above 30 dB. Compared with the test results of both samples, there was not any significant difference between them, indicating the doping concentration of 4% may be sufficient for EMI shielding purpose.

Metal fillers are responsible for the EMI shielding effects in either the conductive or nonconductive BESM and the conductivity of the fillers is utilized for high EMI shielding efficiency. Generally, the more conductive of the filler is, the better the EMI shielding effectiveness would be. However, some very high conductive metal powders, such as copper, did not exhibit EMI shielding efficiently when they were used as fillers in the BESM. The reason may be due to the fact that the copper nanopowders are easily subject to oxidation when exposed to air. Oxidized copper is not a good conductor, therefore, the copper-doped BESM is generally not good for EMI shielding.

Shielding efficiency increased with increasing filler doping concentration (at small doping concentrations). However, it could very quickly reach the saturation point of doping concentration.

The biopolymer-based materials as defined in these embodiments have exhibited high EMI shielding effectiveness while being nonconductive. The nonconductive BESM may have a great potential in the microelectronics industries for EMI shielding applications on electronic devices and circuit boards.

Although the invention has been described with respect to various embodiments, it should be realized this invention is also capable of a wide variety of further and other embodiments within the spirit and scope of the appended claims.

What is claimed is:

1. A method of making an EMI shielding material, the method comprising:
dissolving DNA in a first amount of de-ionized water for a first period of time to form a DNA solution;
dissolving CTMA in a second amount de-ionized water for a second period of time to form a CTMA solution;
making a DNA-CTMA complex by adding the DNA solution to the CTMA solution, thereby causing a DNA-CTMA precipitate to form;

making an alcohol based DNA-CTMA solution by dissolving the DNA-CTMA precipitate in alcohol; and making the EMI shielding material by mixing nano-powders or nanoparticles, the nano-powders or nanoparticles being one of metal or semiconductor nano-powders or nanoparticles, with the alcohol based DNA-CTMA solution.

2. The method of claim 1, wherein a temperature of the first and second amounts of de-inonized water is about 60° F. to about 80° F.

3. The method of claim 1, wherein a ratio of DNA to de-ionized water is about 4 grams/liter.

4. The method of claim 1, wherein the first period of time is about two hours.

5. The method of claim 1, wherein a ratio of CTMA to de-ionized water is about 4 grams/liter.

6. The method of claim 1, wherein the second period of time is about five minutes.

7. The method of claim 1, wherein adding the DNA solution to the CTMA solution comprises adding the DNA solution drop-wise to the CTMA solution.

8. The method of claim 7, wherein a rate of adding the DNA solution drop-wise to the CTMA solution is about 1 drop per minute.

9. The method of claim 1, wherein the nano-powders or nanoparticles are neutral in charge.

10. The method of claim 1, wherein the nano-powders or nanoparticles are metal or carbon based nano-powders or nanoparticles-.

11. A method for scattering an EMI signal, the method comprising:

using the EMI shielding material made by the method of claim 1.

12. A method for shielding of electromagnetic radiation and radar stealth, the method comprising:

using the EMI shielding material made by the method of claim 1.

13. The method of claim 1, wherein the nano-powders or nanoparticles are positively charged.

14. The method of claim 1, wherein the nano-powders or nanoparticles are negatively charged.

15. A method of making an EMI shielding material, the method comprising:

dissolving DNA in a first amount of de-ionized water for a first period of time to form a DNA solution;

mixing positively charged nano-powders or nanoparticles, the nano-powders or nanoparticles being one of metal or semiconductor nano-powders or nanoparticles, to the DNA solution, in order to make a DNA-nano-powder or nanaprticle solution;

dissolving CTMA in a second amount de-ionized water for a second period of time to form a CTMA solution;

making a DNA-CTMA-metal or semiconductor nanopowder or nanoparticle complex by adding the DNA-nano-powder or nanaprticle solution to the CTMA solution, thereby causing a DNA-CTMA-nano-powder or nanparticle precipitate to form;

making an alcohol based DNA-CTMA-nanopowder or nanoparticle EMI shielding material solution by dissolving the DNA-CTMA-nanopowder or nanoparticle precipitate in alcohol.

16. The method of claim 15, wherein a temperature of the first and second amounts of de-inonized water is about 60° F. to about 80° F.

17. The method of claim 15, wherein a ratio of DNA to de-ionized water is about 4 grams/liter.

18. The method of claim 15, wherein the first period of time is about two hours.

19. The method of claim 15, wherein a ratio of CTMA to de-ionized water is about 4 grams/liter.

20. The method of claim 15, wherein the second period of time is about five minutes.

21. The method of claim 15, wherein adding the DNA-nano-powder or nanaprticle solution to the CTMA solution comprises adding the DNA solution drop-wise to the CTMA solution.

22. The method of claim 21, wherein a rate of adding the DNA-nano-powder or nanaprticle solution drop-wise to the CTMA solution is about 1 drop per minute.

23. The method of claim 15, wherein the nano-powders or nanoparticles are metal or carbon based nano-powders or nanoparticles.

24. A method of making an EMI shielding material, the method comprising:

dissolving DNA in a first amount of de-ionized water for a first period of time to form a DNA solution;

dissolving CTMA in a second amount de-ionized water for a second period of time to form a CTMA solution;

mixing negatively charged nano-powders or nanoparticles, the nano-powders or nanoparticles being one of metal or semiconductor nano-powders or nanoparticles, to the CTMA solution, in order to make a CTMA-nano-powder or nanaprticle solution;

making a DNA-CTMA-nano-powder or nanoparticle complex by adding the DNA solution to CTMA-nano-powder or nanaprticle solution, thereby causing a DNA-CTMA-nano-powder or nanparticle precipitate to form;

making an alcohol based DNA-CTMA-nano-powder or nanoparticle EMI shielding material solution by dissolving the DNA-CTMA-nano-powder or nanoparticle precipitate in alcohol.

25. The method of claim 24, wherein a temperature of the first and second amounts of de-inonized water is about 60° F. to about 80° F.

26. The method of claim 24, wherein a ratio of DNA to de-ionized water is about 4 grams/liter.

27. The method of claim 24, wherein the first period of time is about two hours.

28. The method of claim 24, wherein a ratio of CTMA to de-ionized water is about 4 grams/liter.

29. The method of claim 24, wherein the second period of time is about five minutes.

30. The method of claim 24, wherein adding the DNA solution to the CTMA-nano-powder or nanaprticle solution comprises adding the DNA solution drop-wise to the CTMA solution.

31. The method of claim 30, wherein a rate of adding the DNA solution drop-wise to the CTMA-nano-powder or nanaprticle solution is about 1 drop per minute.

32. The method of claim 24, wherein the nano-powders or nanoparticles are metal or carbon based nano-powders or nanoparticles.

* * * * *